United States Patent [19]

Lee

[11] Patent Number: 4,732,658

[45] Date of Patent: Mar. 22, 1988

[54] PLANARIZATION OF SILICON SEMICONDUCTOR DEVICES

[75] Inventor: Eddie C. Lee, Bloomington, Minn.

[73] Assignee: Honeywell Inc., Minneapolis, Minn.

[21] Appl. No.: 937,577

[22] Filed: Dec. 3, 1986

[51] Int. Cl.$^4$ .................. C23C 14/34; H01L 21/308; H01L 21/324

[52] U.S. Cl. .................. 437/228; 204/192.23; 204/192.3; 204/192.22; 156/653; 156/659.1; 156/662; 427/255; 430/313; 430/317

[58] Field of Search .................. 204/192.12, 192.15, 204/192.22, 192.23, 192.3; 427/85, 95, 255; 148/DIG. 133; 430/313, 317; 156/643, 646, 662, 663, 659.1, 653

[56] References Cited

U.S. PATENT DOCUMENTS

| | | | |
|---|---|---|---|
| 3,983,022 | 9/1976 | Auyang et al. | 204/192.3 X |
| 4,007,103 | 2/1977 | Baker et al. | 204/192.23 X |
| 4,191,603 | 3/1980 | Garbarino et al. | 148/187 |
| 4,433,008 | 2/1984 | Schnable et al. | 427/85 |
| 4,455,194 | 6/1984 | Yabu et al. | 430/317 X |
| 4,474,831 | 10/1984 | Downey | 427/85 X |

FOREIGN PATENT DOCUMENTS 0127851 7/1984 Japan .................. 148/DIG. 133
0053050 3/1985 Japan .................. 148/DIG. 133

OTHER PUBLICATIONS

S. Shanfield, et al., "Process Characterization of PSG and BPSG Plasma Deposition", LFE Corporation, Clinton, MA 01510.
C. Ramiller et al., "Borophosphosilicate Glass for Low Temperature Reflow".
Avigal, "Inter-Metal Dielectric and Passivation-Related Properties of Plasma BPSG", Intel Corporation, Santa Clara, CA.
J. E. Tong et al., "Process and Film Characterization of PECVD Porophosphosilicate Films for VLSI Applications", Solid St. Tech., 1984.

Primary Examiner—John F. Niebling
Assistant Examiner—Nam X. Nguyen
Attorney, Agent, or Firm—William T. Udseth

[57] ABSTRACT

A substantially planar surface is provided over a silicon semiconductor device by depositing a silicate glass, heating the silicate glass so it reflows, bias sputtering a dielectric layer over the reflowed glass, depositing a photoresist over the dielectric layer and etching away the photoresist and enough of the dielectric to provide a substantially planar surface of the dielectric material. Quartz is the preferred dielectric material.

5 Claims, 7 Drawing Figures

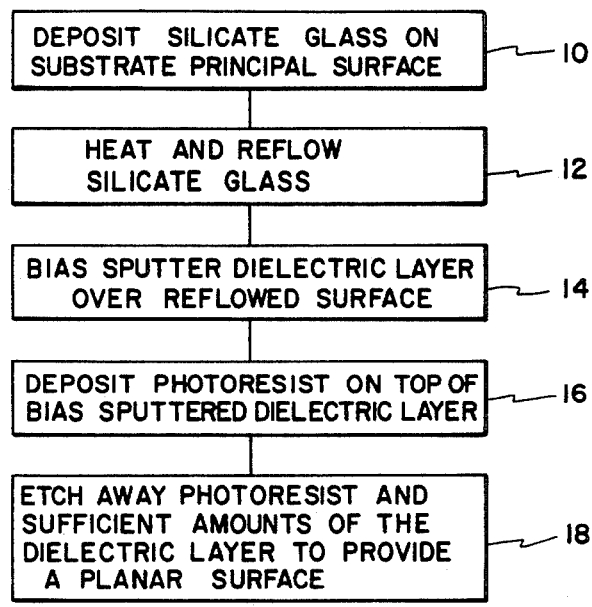
Fig._1
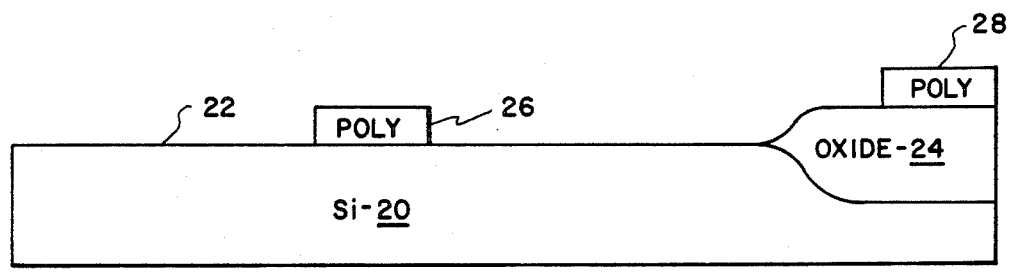
Fig. 2
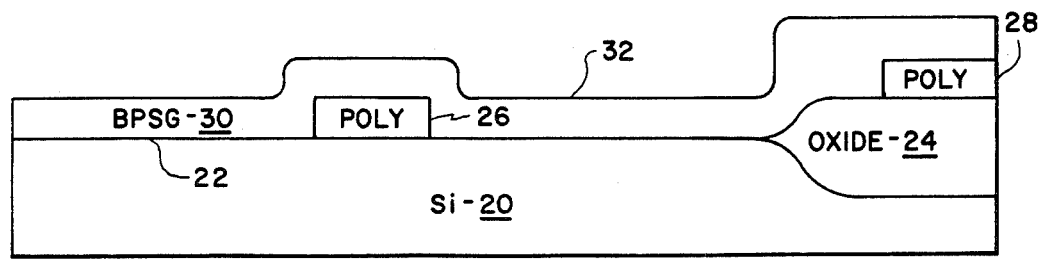
Fig. 3
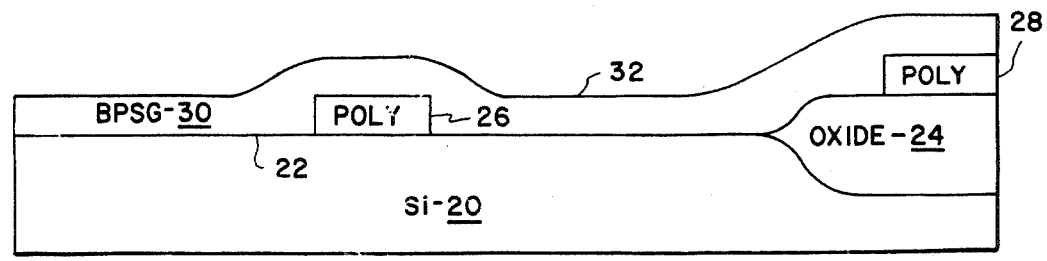
Fig. 4

PLANARIZATION OF SILICON SEMICONDUCTOR DEVICES

BACKGROUND OF THE INVENTION

1. Field of the Invention

This invention relates to processes for providing substantially planar surfaces at selected points in silicon semiconductor device processes.

2. Related Art

Semiconductor devices formed in silicon substrates, such as bipolar transistors or metal-oxide semiconductor (MOS) transistors, typically employ multiple layers of metal (or other high conductivity material) over device features (such as a MOS gate) which protrude from the substrate's principal surface. The metal layers may or may not be separated by dielectric layers.

These overlying metal and dielectric layers conform, approximately, to the surface formed by the principal surface of the substrate and the protruding device features. As layers are added, irregularities in the upper surface of the immediate underlying layer due to the protruding features, become more and more exaggerated. In extreme cases, an overlying layer will become discontinuous at a site where a series of layers have been stacked over a recess. More commonly, the exaggerated irregularity will leave the upper layers with numerous fragile stress points.

One early attempt to ameliorate the negative effects of underlying irregularities on multiple overlayers, was to deposit borophosphosilicate glass (BSPG) as an overlayer, and reflow the glass. This provided a smoothly contoured surface over device features protruding from the substrate surface, but the smoothly contoured surface still roughly conformed to the underlying features and was thus nonplanar. This nonplanar surface would eventually result in the above described layer discontinuities or stress points if multiple layers were formed over it.

Further, as device feature sizes are reduced to 0.25 μm and smaller, what had been acceptable minute faults in overlayers become intolerable, process limiting barriers.

Although use of a BPSG reflow layer was an improvement, a method of providing a planar surface over semiconductor device features which protrude from the principal surface of a silicon substrate is highly desirable and, heretofore, unavailable.

SUMMARY OF THE INVENTION

The present invention is a process for providing a substantially planar surface over a semiconductor device, where the device is formed, at least in part, in a silicon substrate, where the silicon substrate has a principal surface and where the device features extend or protrude form, or are formed upon, the principal surface.

The method comprises the steps of:
(a) depositing a layer of silicate glass (either BPSG, borosilicate glass, phosphosilicate glass or arsenic doped silicate glass) over the protruding device features and that portion of the principal surface adjacent these features;
(b) heating the silicate glass layer sufficiently to cause the silicate glass to reflow and form a layer with a smoothly contoured upper surface;
(c) depositing a dielectric layer (such as quartz or $Si_3N_4$) over the smoothly contoured upper surface by bias sputtering;
(d) depositing a photoresist on top of the bias sputtered dielectric layer; and
(e) etching away (with an etch process which etches the dielectric and the photoresist at substantially the same rate) all of the photoresist, and enough of the dielectric layer to form a substantially planar surface of the dielectric material over the protruding features.

BRIEF DESCRIPTION OF THE DRAWINGS

FIG. 1 is a flow chart of the method of the present invention.

FIG. 2 is a sectional view of a silicon substrate with device features protruding from its principal surface.

FIG. 3 is a sectional view of the substrate of FIG. 2 after the first step of the present invention.

FIG. 4 is a sectional view of the substrate of FIG. 2 after the second step of the present invention.

DESCRIPTION OF THE PREFERRED EMBODIMENT

Figure 5:
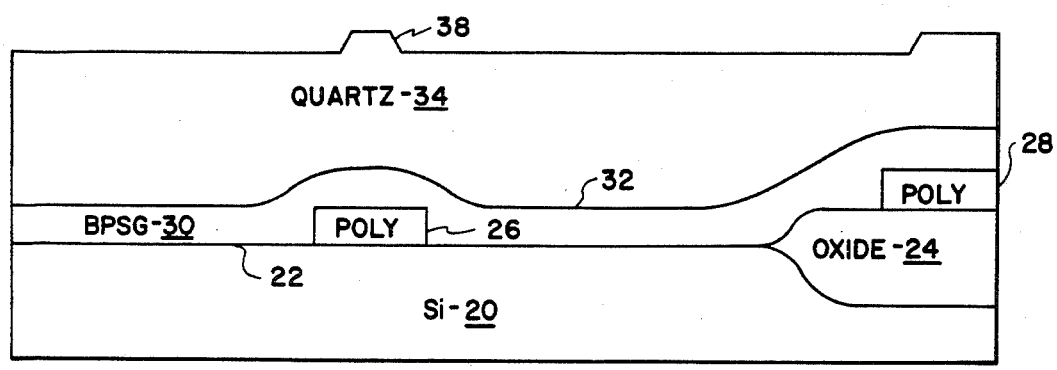
FIG. 5 is a sectional view of the substrate of FIG. 2 after the third step of the present invention.
Figure 6:
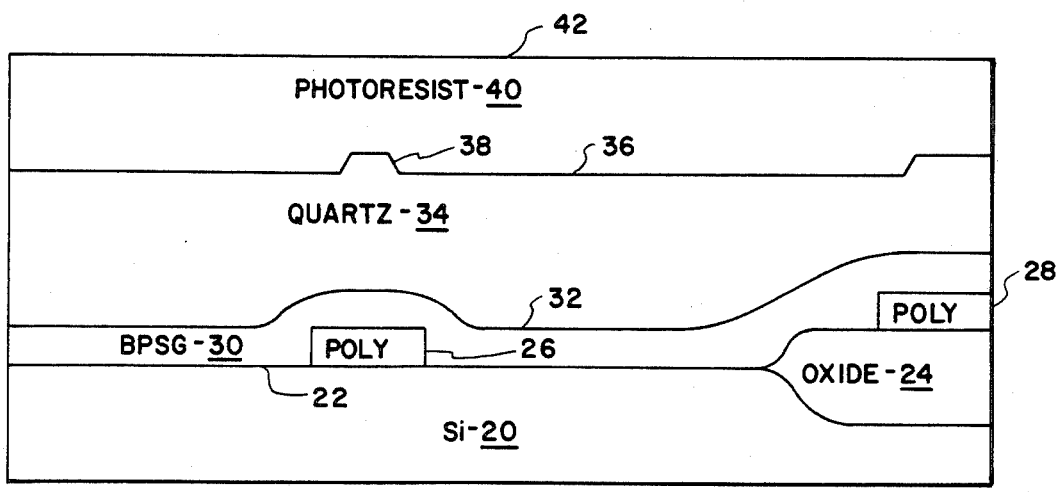
FIG. 6 is a sectional view of the substrate of FIG. 2 after the fourth step of the present invention.

FIG. 1 is a flow chart summarizing the basic steps, steps 10, 12, 14, 16 and 18, in the process of method of the present invention. These steps will be described below in conjunction with FIGS. 2–6.

FIG. 2 depicts a portion of a semiconductor chip which is readied for the process of the present invention. FIG. 2 also provides a sectional view of a generalized Si substrate 20 (with or without an explicit epitaxial layer) having a principal surface 22. An insulating layer, such as oxide 24, typically will cover part of surface 22, and in fact extend into substrate 20 a small distance. Semiconductor device features, such as polysilicon pads 26 and 28, will extend above surface 22.

FIG. 3 depicts substrate 20 after step 10 has been completed. A silicate glass such as borophosphosilicate glass (BPSG) is deposited over the region of interest as an approximately uniform thickness layer 30. The glass is preferably deposited by an atmospheric system such as a chemical vapor deposition (CVD) process. A review of suitable atmospheric systems is given in W. Kern, G. L. Schnable, RCA Review, Vol. 43, pgs. 423–457, Sept. 1982, the same being incorporated herein by reference. A variation of atmospheric CVD systems called plasma-enhanced CVD (PECVD) could also be used to deposit the silicate glass. PECVD is more particularly described in "Process and Film Characterization of PECVD Borophosphosilicate Films for VLSI Applications", J. E. Tong, K. Schertenleib and R. A. Carpio, Solid State Technology, pgs. 161–170, Jan. 1984, the same being incorporated herein by reference. Other deposition processes, such as low pressure CVD, may also be used to deposit the silicate glass.

More specifically, and by way of example, a layer of 4% doped boron and 4% doped phosphorous BPSG, which is approximately 0.5 micrometer thick, can be deposited at 430° C. with a Watkin Johnson 985 atmospheric CVD system.

BPSG layer 30 is substantially conformal. That is, sectional profiles of device features which extend beyond surface 22, such as polysilicon pad 26, are substantially reproduced by the upper surface 32 of layer 30.

Other silicate glasses such as phosphosilicate glass, borosilicate glass or arsenic doped silicate glass may also be used as layer 30.

The second step, step 12, of the present invention is to heat layer 30 until it reflows. FIG. 4 shows the semiconductor structure after step 12. Reflow of layer 30 reduces sharp features in the sectional profile of layer 30, but features such as pad 26 still prevent surface 32 of layer 30 from being substantially planar. Reflow can be accomplished in the example of the 0.5 μm BPSG layer described above, by heating layer 30 at 975° C. for 15 minutes. As is standard in glass reflow techniques, the reflow temperature should remain below the drive-in temperature used to activate dopants in the particular device being processed.

FIG. 5 depicts substrate 20 after step 14 of the invention process. Therein a dielectric layer 34, such as quartz, i.e. $SiO_2$, has been bias sputtered over BPSG layer 30. Bias sputtering is the preferred method of forming layer 34. That is, in addition to the normal bombardment of a target (generally the cathode) with ions from a sputter chamber atmosphere to deposit a film on a substrate, the substrate is also biased. Typically this is a small negative bias. In the above example of the 0.5 μm BPSG layer, a 1.9 μm layer of quartz is deposited with a −150v potential applied to the substrate, and 2 kilowatts of RF power to the cathode/target with Argon ions bombarding an $SiO_2$ target.

The bias voltage on the substrate enhances the removal of material from the upper surface 36 of dielectric layer 34. Because the sputter yield in bias sputtering is a nonuniform function of the angle of incidence of the ions on surface 36, sharp corners on surface 36 will have more material removed therefrom than planar areas. Thus bias sputtering will reduce the size of protrusions in surface 36 of layer 34.

Note in FIG. 5 how the relatively large bump in surface 32 over pad 26 has been reduced to a small protrusion 38. $Si_3N_4$ may also be suitable as a material for layer 34.

Step 16 is the deposition (i.e. spinning on) of a photoresist layer 40 over surface 36. Again using the above example, a 2 μm layer of a photoresist such as Kodak 820 (a novalac resin with diazoquinone as a sensitizer) is suitable. The viscosity of the photoresist is sufficiently low to provide a substantially planar surface 42 as the upper surface of the stacked layers.

Figure 7:
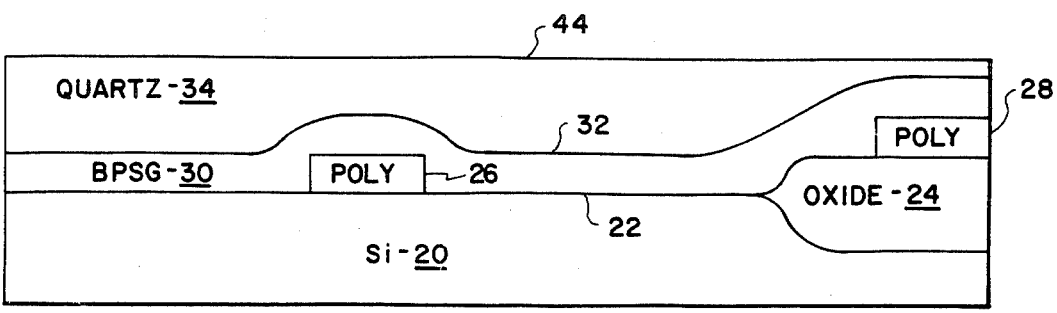
FIG. 7 is a sectional view of the substrate of FIG. 2 after completion of the process of the present invention.

The final step in the process, step 18, is to etch photoresist 40 and enough of the dielectric layer 34 to provide a substantially flat surface of a dielectric material over the region of interest. FIG. 7 shows the result (see surface 44) of etch step 18.

In the above example, step 18 is a reactive ion etch in an atmosphere of $CHF_3$ and $O_2$ in a ratio of 2:1. Pressure is set at 12 milli-Torr and the RF power is 1200 watts. The etch was stopped when the total thickness between surfaces 22 and 44 was 0.3 μm. The stop time of the etch step is determined by calibrating the particular etch mechanism with the particular photoresist and dielectric used. Of course the selectivity between the dielectric and the photoresist etch rate can be adjusted by, for example, varying the amount of oxygen in the etchant atmosphere. Dry etching is preferred but a wet etch is also possible.

It is important to match the etch rate of photoresist 40 as closely as possible to the etch rate of dielectric layer 34. This is because by so doing, the planar surface 42 of the photoresist can be transferred to the oxide surface. With matched etch rates, the etch will proceed through photoresist 40 and into layer 34 evenly, despite protrusions from upper surface 36 of layer 34 such as bump 38.

The semiconductor device is now prepared for the deposition of further layers, metalization and/or the cutting of vias, with the problems attendant stacking layers over substrate surface protrusions essentially eliminated.

The above example, gives one suitable planarizing dielectric layer system, i.e. reflow BPSG and high bias sputter $SiO_2$ with photoresist, which after etching back, results in a totally planar surface. However, other dielectrics (which are otherwise compatible with the device structure and processes) with planarizing ability and which are compatible with the photoresist can be used with the present invention.

What is claimed is:

1. A method of providing a substantially planar surface over a semiconductor device, wherein said device is formed, at least in part, in a silicon substrate, said silicon substrate having a principal surface and wherein some device features extend from or are formed upon said principal surface, the method comprising the steps of:

depositing a layer of silicate glass selected from the group consisting of borophosphosilicate glass, borosilicate glass, phosphosilicate glass and arsenic doped silicate glass, over said device features and at least that portion of said principal surface adjacent said features;

heating said silicate glass layer sufficiently to cause said silicate glass to reflow and form a layer with a smoothly contoured upper surface;

depositing a layer of dielectric material over said smoothly contoured upper surface by bias sputtering;

depositing a photoresist on top of said dielectric layer; and etching away all of said photoresist and a sufficient portion of said dielectric layer by an etching process which etches said dielectric and said photoresist at substantially the same rate, to provide a substantially planar surface of said dielectric layer.

2. The method of claim 1 wherein said dielectric layer is comprised of quartz and said photoresist is a novalac resin with diazoquinone as a photosensitizer.

3. The method of claim 1 wherein said silicate glass is borophosphosilicate glass wherein said silicate glass is doped with 4% boron and 4% phosphorous.

4. The method of claim 1 wherein said bias sputtering comprises:

placing said substrate within a sputtering chamber;
   providing a sputtering atmosphere within said chamber;
   providing a target comprised of said dielectric material within said chamber;
   applying a first electrical potential to said target; and
   applying a second electrical potential to said substrate, wherein said second electrical potential is negative relative to said first electrical potential.

5. The method of claim 1 wherein said etching process is a reactive ion etch.

* * * * *